United States Patent
Kawabata et al.

(10) Patent No.: US 8,004,433 B2
(45) Date of Patent: Aug. 23, 2011

(54) SEMICONDUCTOR INTEGRATED CIRCUIT AND TRANSMITTER APPARATUS HAVING THE SAME

(75) Inventors: Manabu Kawabata, Osaka (JP); Ryogo Yanagisawa, Osaka (JP); Toru Iwata, Osaka (JP); Hirokazu Sugimoto, Osaka (JP)

(73) Assignee: Panasonic Corporation, Osaka (JP)

( * ) Notice: Subject to any disclaimer, the term of this patent is extended or adjusted under 35 U.S.C. 154(b) by 161 days.

(21) Appl. No.: 12/376,405

(22) PCT Filed: Jul. 31, 2007

(86) PCT No.: PCT/JP2007/065006
§ 371 (c)(1),
(2), (4) Date: Feb. 4, 2009

(87) PCT Pub. No.: WO2008/018325
PCT Pub. Date: Feb. 14, 2008

(65) Prior Publication Data
US 2010/0245663 A1 Sep. 30, 2010

(30) Foreign Application Priority Data
Aug. 10, 2006 (JP) .................... 2006-218429

(51) Int. Cl.
*H03M 9/00* (2006.01)
(52) U.S. Cl. .......................... 341/101; 341/50
(58) Field of Classification Search ............. 341/100, 341/101, 50
See application file for complete search history.

(56) References Cited

U.S. PATENT DOCUMENTS

| 5,974,464 A | 10/1999 | Shin et al. |
| 2005/0027993 A1 | 2/2005 | Yanagisawa |
| 2007/0296617 A1* | 12/2007 | Murata et al. .............. 341/101 |

FOREIGN PATENT DOCUMENTS

| JP | 2002-314970 | 10/2002 |
| JP | 2003-102034 | 4/2003 |
| JP | 2005-051558 | 2/2005 |

* cited by examiner

*Primary Examiner* — Peguy JeanPierre
(74) *Attorney, Agent, or Firm* — McDermott Will & Emery LLP

(57) ABSTRACT

A semiconductor integrated circuit (10D) for receiving a parallel data signal and a first clock signal and outputting a serial data signal and a second clock signal, wherein a first clock generation circuit (15) produces a third clock signal obtained by multiplying the first clock signal by X/Y. A second clock generation circuit (11) has a variable transmission characteristic, and produces a fourth clock signal obtained by multiplying the third clock signal by N. A parallel/serial conversion section (12) converts the parallel data signal, which has been converted by a scaler (16), to the serial data signal in synchronism with the fourth clock signal. A frequency divider (13) produces a fifth clock signal obtained by dividing a frequency of the fourth clock signal by N. A selector (14) selectively outputs, as the second clock signal, one of the third and fifth clock signals.

14 Claims, 7 Drawing Sheets

Switched according to receiver apparatus characteristics

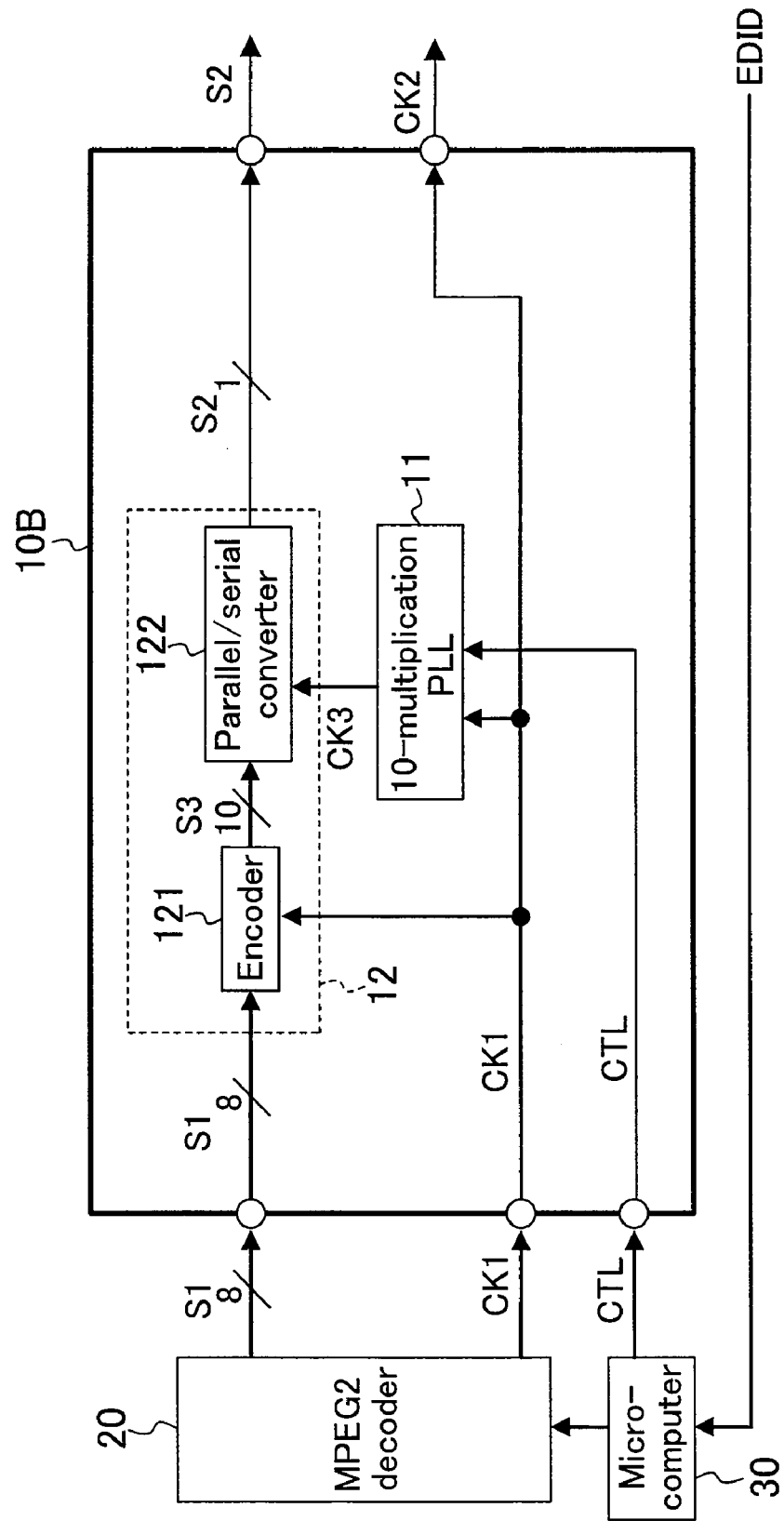

SEMICONDUCTOR INTEGRATED CIRCUIT AND TRANSMITTER APPARATUS HAVING THE SAME

RELATED APPLICATIONS

This application is the U.S. National Phase under 35 U.S.C. §371 of International Application No. PCT/JP2007/065006, filed on Jul. 31, 2007, which in turn claims the benefit of Japanese Application No. 2006-218429, filed on Aug. 10, 2006, the disclosures of which Applications are incorporated by reference herein.

TECHNICAL FIELD

The present invention relates to a digital signal transmitter apparatus and, more particularly, to a transmitter apparatus for serially transmitting AV data to a receiver apparatus connected thereto via a cable.

BACKGROUND ART

Standards for serially transmitting AV data between devices connected together via a cable include DVI (Digital Visual Interface) and HDMI (High Definition Multimedia Interface). DVI is a standard for serially transmitting video data. HDMI is backward compatible with DVI, and allows for serial transmission of audio data in addition to video data. With a transmission system in conformity with these standards, a parallel data signal representing video and audio is converted in the transmitter apparatus to a serial data signal in synchronism with a clock signal inside the transmitter apparatus, and the serial data signal and the clock signal are transmitted to the receiver apparatus. The data signal is transmitted at a relatively high frequency since it is parallel/serial-converted, whereas the clock signal is transmitted at a relatively low frequency, i.e., the same frequency as the parallel data signal. Then, in the receiver apparatus, a data recovery clock signal is produced from the received clock signal, and the received serial data signal is converted to a parallel data signal in synchronism with the produced clock signal. Thus, AV data being parallel data is serially transmitted from the transmitter apparatus to the receiver apparatus (see, for example, Patent Document 1).

The clock transmission schemes for the above transmission system include the coherent clocking scheme and the non-coherent clocking scheme. In the coherent clocking scheme, a clock signal obtained by dividing the frequency of a clock signal produced for parallel/serial conversion is transmitted. For example, with 10-bit parallel/serial conversion, the transmitter apparatus produces a 10-times clock signal by multiplying the frequency of the reference clock signal being in synchronism with the parallel data signal by 10, and a clock signal obtained by dividing the frequency of the 10-times clock signal by 10 is transmitted to the receiver apparatus. In the non-coherent clocking scheme, a clock signal in synchronism with the parallel data signal is transmitted as it is. For example, with 10-bit parallel/serial conversion, while the transmitter apparatus produces a 10-times clock signal by multiplying the frequency of the reference clock signal being in synchronism with the parallel data signal by 10, the reference clock signal is transmitted to the receiver apparatus.

Patent Document 1: Japanese Laid-Open Patent Publication No. 2002-314970

DISCLOSURE OF THE INVENTION

Problems to be Solved by the Invention

In a transmission system in conformity with a standard such as DVI or HDMI, the receiver apparatus may fail to recover the parallel data signal, thus leaving noise on the video or audio output, due to the influence of fluctuation in the time axis direction ("jitter") of each of the serial data signal and the clock signal transmitted. The jitter resistance varies between the coherent clocking scheme and the non-coherent clocking scheme.

In the coherent clocking scheme, the jitter of the transmitted clock signal and that of the transmitted serial data signal are linked with each other. In other words, in the coherent clocking scheme, the phase difference between the transmitted serial data signal and the transmitted clock signal is always kept constant or nearly constant. Therefore, whether the receiver apparatus can recover the parallel data signal depends on the characteristics of the receiver apparatus. If the receiver apparatus is designed for use in the coherent clocking scheme, the receiver apparatus can recover the parallel data signal even if the jitter of the transmitted clock signal is relatively large. Otherwise, the receiver apparatus may be unable to recover the parallel data signal.

In contrast, in the non-coherent clocking scheme, the jitter of the serial data signal appears irrespective of that of the transmitted clock signal. In other words, in the non-coherent clocking scheme, the phase difference between the clock signal and the serial data signal is not kept constant. Therefore, whether the receiver apparatus can recover the parallel data signal depends on whether the transmission characteristic of a clock generation circuit for producing a clock signal for parallel/serial conversion in the transmitter apparatus is equal to that of a clock recovery circuit for producing a data recovery clock signal in the receiver apparatus. If their transmission characteristics are substantially equal to each other, there is produced in the receiver apparatus a clock signal having the same jitter characteristic as that of the clock signal used for parallel/serial conversion, whereby the parallel data signal can be recovered even if the jitter of the transmitted clock signal is relatively large. If their transmission characteristics are substantially different from each other, however, the receiver apparatus may be unable to recover the parallel data signal.

For reasons above, a transmitter apparatus and a receiver apparatus should have various characteristics, such as the clock transmission scheme, matched with each other, and the transmitter apparatus is customized so as to match particular receiver apparatus characteristics. However, if a customized transmitter apparatus is connected to a receiver apparatus of different characteristics, there will be a characteristics mismatch between the transmitter apparatus and the receiver apparatus, whereby the receiver apparatus may be unable to recover the parallel data signal. Thus, conventional transmitter apparatuses have relatively poor connectivity, and it is difficult to use them in combination with various receiver apparatuses.

Moreover, jitter entailing cable transmission is superimposed on the clock signal transmitted from the transmitter apparatus to the receiver apparatus. Jitter is also superimposed by the clock recovery circuit in the receiver apparatus on the clock signal received by the receiver apparatus. If the jitter of the clock signal used in serial/parallel conversion in the receiver apparatus becomes too large, the receiver apparatus can no longer recover the parallel data signal. In other words, the acceptable jitter level of the clock signal received by the receiver apparatus can be said to vary from one apparatus to another. Therefore, in order to increase the connectivity of the transmitter apparatus, it is preferred that the jitter of the clock signal transmitted from the transmitter apparatus is removed as much as possible even if it is within the acceptable range by the standard.

In view of problems as set forth above, an object of the present invention is to provide a semiconductor integrated circuit for transmitting a serial data signal and a clock signal in conformity with a predetermined standard and a transmitter apparatus having the same, wherein the connectivity with receiver apparatuses of various characteristics is increased and jitter is sufficiently removed from the transmitted clock signal.

Means for Solving the Problems

In order to solve problems as set forth above, the present invention provides the following. A first semiconductor integrated circuit is a semiconductor integrated circuit for receiving a parallel data signal and a first clock signal and outputting a serial data signal and a second clock signal, including: a clock generation circuit for receiving the first clock signal and producing a third clock signal obtained by multiplying the first clock signal by N, where N is an integer of 1 or more; a parallel/serial conversion section for receiving the parallel data signal and converting the parallel data signal to the serial data signal in synchronism with the third clock signal; a frequency divider for receiving the third clock signal and producing a fourth clock signal obtained by dividing a frequency of the third clock signal by N; and a selector for receiving the first and fourth clock signals and selectively outputting, as the second clock signal, one of these clock signals according to a control signal given thereto.

With this, it is possible to switch the clock transmission scheme of the transmitter apparatus from one to another according to the characteristics of the receiver apparatus. Therefore, the connectivity of the transmitter apparatus is improved.

A second semiconductor integrated circuit is a semiconductor integrated circuit for receiving a parallel data signal and a first clock signal and outputting a serial data signal and a second clock signal, including: a clock generation circuit for receiving the first clock signal and producing a third clock signal obtained by multiplying the first clock signal by N, where N is an integer of 1 or more; and a parallel/serial conversion section for receiving the parallel data signal and converting the parallel data signal to the serial data signal in synchronism with the third clock signal, wherein a transmission characteristic of the clock generation circuit varies according to a control signal given thereto.

With this, it is possible to change the transmission characteristic of the clock generation circuit in the transmitter apparatus according to the transmission characteristic of a clock recovery circuit in the receiver apparatus. Therefore, the connectivity of the transmitter apparatus is improved.

A third semiconductor integrated circuit is a semiconductor integrated circuit for receiving a parallel data signal and a first clock signal and outputting a serial data signal and a second clock signal, including: a first clock generation circuit for receiving the first clock signal and producing a third clock signal obtained by multiplying the first clock signal by X/Y, where X and Y are natural numbers and X≠Y; a scaler for receiving the parallel data signal and converting the parallel data signal to a second parallel data signal in synchronism with the third clock signal; a second clock generation circuit for receiving the third clock signal and producing a fourth clock signal obtained by multiplying the third clock signal by N, where N is an integer of 1 or more; and a parallel/serial conversion section for receiving the second parallel data signal and converting the second parallel data signal to the serial data signal in synchronism with the fourth clock signal.

With this, it is possible to transmit a clock signal that has been shaped through two steps of the first and second clock generation circuits in the coherent clocking scheme and through the first clock generation circuit in the non-coherent clocking scheme, whereby it is possible to sufficiently remove jitter from the clock signal transmitted.

Preferably, a pass band of the first clock generation circuit varies according to a control signal given thereto. With this, it is possible to effectively remove jitter of the clock signal transmitted from the transmitter apparatus according to the characteristics of the receiver apparatus, etc.

A transmitter apparatus, having one of the semiconductor integrated circuits set forth above, includes a data generation circuit for producing the parallel data signal and the first clock signal to be input to the semiconductor integrated circuit; and a control circuit for producing the control signal to be input to the semiconductor integrated circuit based on information regarding a receiver apparatus receiving the serial data signal and the second clock signal output from the semiconductor integrated circuit.

With this, the selection operation of the selector, the transmission characteristic of the clock generation circuit, the pass band of the first clock generation circuit, etc., in the semiconductor integrated circuit can be optimally controlled by the control circuit based on information regarding the receiver apparatus.

Preferably, the control circuit obtains the information from the receiver apparatus. With this, the characteristics of the transmitter apparatus can be changed automatically according to the characteristics of the receiver apparatus.

A transmitter apparatus including the third semiconductor integrated circuit as set forth above, includes: a data generation circuit for producing the parallel data signal and the first clock signal to be input to the semiconductor integrated circuit; and a control circuit for producing the control signal to be input to the semiconductor integrated circuit, wherein: the data generation circuit switches a frequency of the first clock signal from one to another according a control by the control circuit; and at a time of instructing the data generation circuit to switch a frequency of the first clock signal from one to another, the control circuit switches the control signal to another control signal corresponding to the frequency of the first clock signal after the switching.

With this, the pass band of the first clock generation circuit in the semiconductor integrated circuit can be optimally controlled by the control circuit according to the frequency of the clock signal output from the data generation circuit.

EFFECTS OF THE INVENTION

As described above, according to the present invention, the connectivity of the transmitter apparatus is improved, and jitter of the clock signal transmitted can be removed sufficiently. Thus, the receiver apparatus receiving the serial data signal and the clock signal from the transmitter apparatus of the present invention can recover the parallel data signal without mis-latching, and noise on the displayed image, etc., is reduced.

BRIEF DESCRIPTION OF THE DRAWINGS

FIG. 4 shows a configuration of a transmitter apparatus according to a second embodiment.

Figure 1:
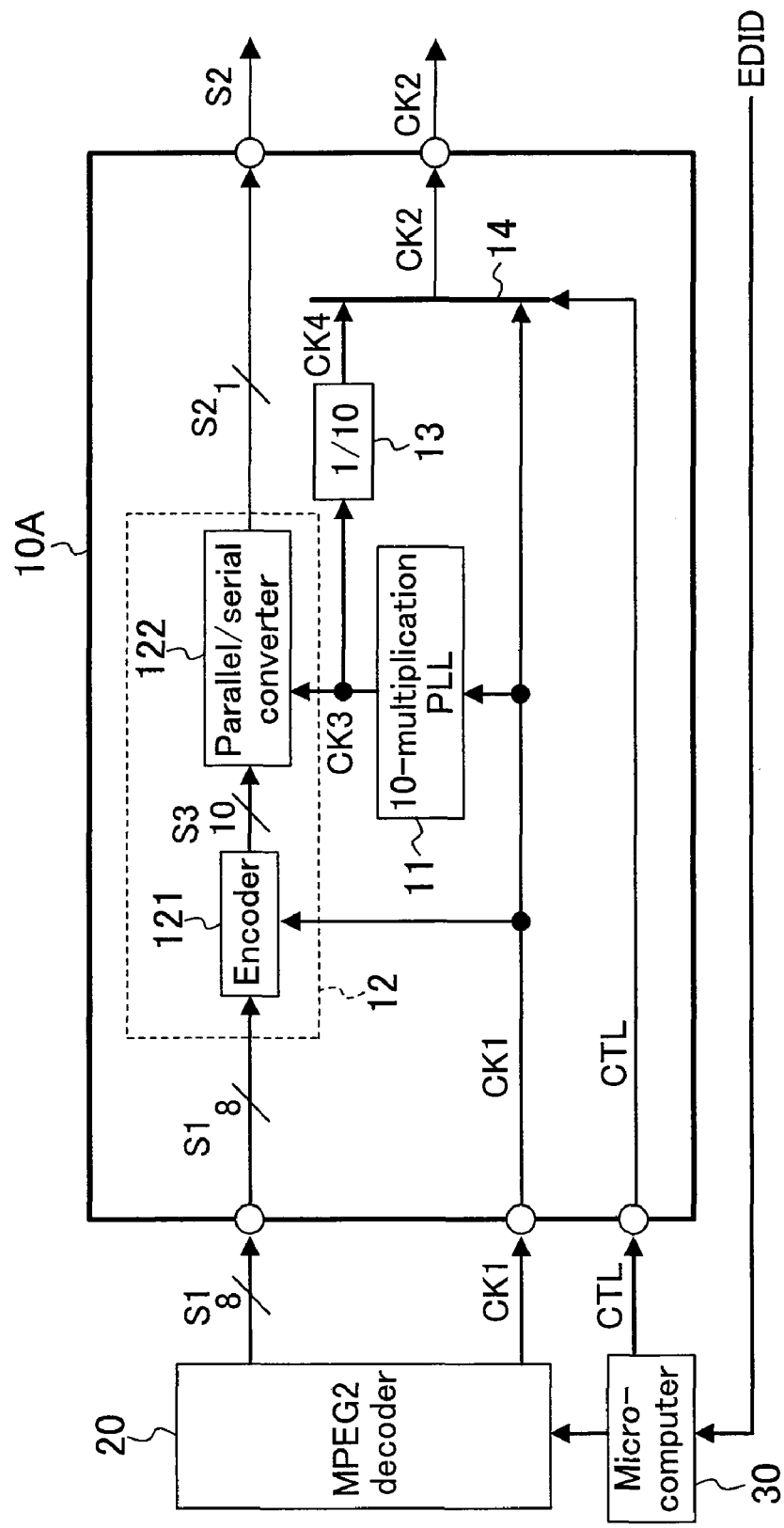
FIG. 1 shows a configuration of a transmitter apparatus according to a first embodiment.

DESCRIPTION OF REFERENCE NUMERALS 10A to 10D Semiconductor integrated circuit
11 10-multiplication PLL (clock generation circuit, second clock generation circuit)
12 Parallel/serial conversion section
13 Frequency divider
14 Selector
15 Clock generation circuit (first clock generation circuit)
16 Scaler
20 MPEG2 decoder (data generation circuit)
30 Microcomputer (control circuit)

BEST MODE FOR CARRYING OUT THE INVENTION

Best mode for carrying out the invention will now be described with reference to the drawings.

First Embodiment

FIG. 1 shows a configuration of a transmitter apparatus according to a first embodiment. The present transmitter apparatus serially transmits data via a cable to a receiver apparatus to be described later in conformity with a standard such as DVI or HDMI. Specifically, the present transmitter apparatus includes a semiconductor integrated circuit 10A, an MPEG2 decoder 20, and a microcomputer 30. The semiconductor integrated circuit 10A receives a parallel data signal S1 and a clock signal CK1 and outputs a serial data signal S2 and a clock signal CK2. The MPEG2 decoder 20 is a data generation circuit for decoding MPEG2 data recorded on a DVD, or the like, and outputting the video signal as an 8-bit parallel data signal S1 while outputting the clock signal CK1 in synchronism with the parallel data signal S1. The microcomputer 30 is a control circuit for controlling the operations of the semiconductor integrated circuit 10A and the MPEG2 decoder 20. While a video signal is transmitted through three channels of R, G and B in practice, a single-channel transmission will be described for the sake of simplicity.

The semiconductor integrated circuit 10A includes a 10-multiplication PLL 11, a parallel/serial conversion section 12, a frequency divider 13, and a selector 14. The 10-multiplication PLL 11 is a clock generation circuit for receiving the clock signal CK1 and producing a clock signal CK3 having a frequency that is 10 times higher. The parallel/serial conversion section 12 receives the parallel data signal S1 and converts the parallel data signal S1 to the serial data signal S2 in synchronism with the clock signal CK3. The frequency divider 13 receives the clock signal CK3 and divides the frequency thereof by 10 to thereby produce a clock signal CK4. The selector 14 receives the clock signals CK1 and CK4, and selectively outputs one of these as the clock signal CK2 based on a control signal CTL from the microcomputer 30.

An encoder 121 in the parallel/serial conversion section 12 converts the 8-bit data signal S1 to a 10-bit data signal S3 in synchronism with the clock signal CK1. In the 8-bit/10-bit conversion, two bits are added to the data signal S1 so that, when the data signal S3 is converted to a serial data signal, "1"s or "0"s will not appear in the serial data signal consecutively over a long period while achieving the DC balance. A parallel/serial converter 122 in the parallel/serial conversion section 12 converts the data signal S3 to the serial data signal S2 in synchronism with the clock signal CK3.

Figure 2:
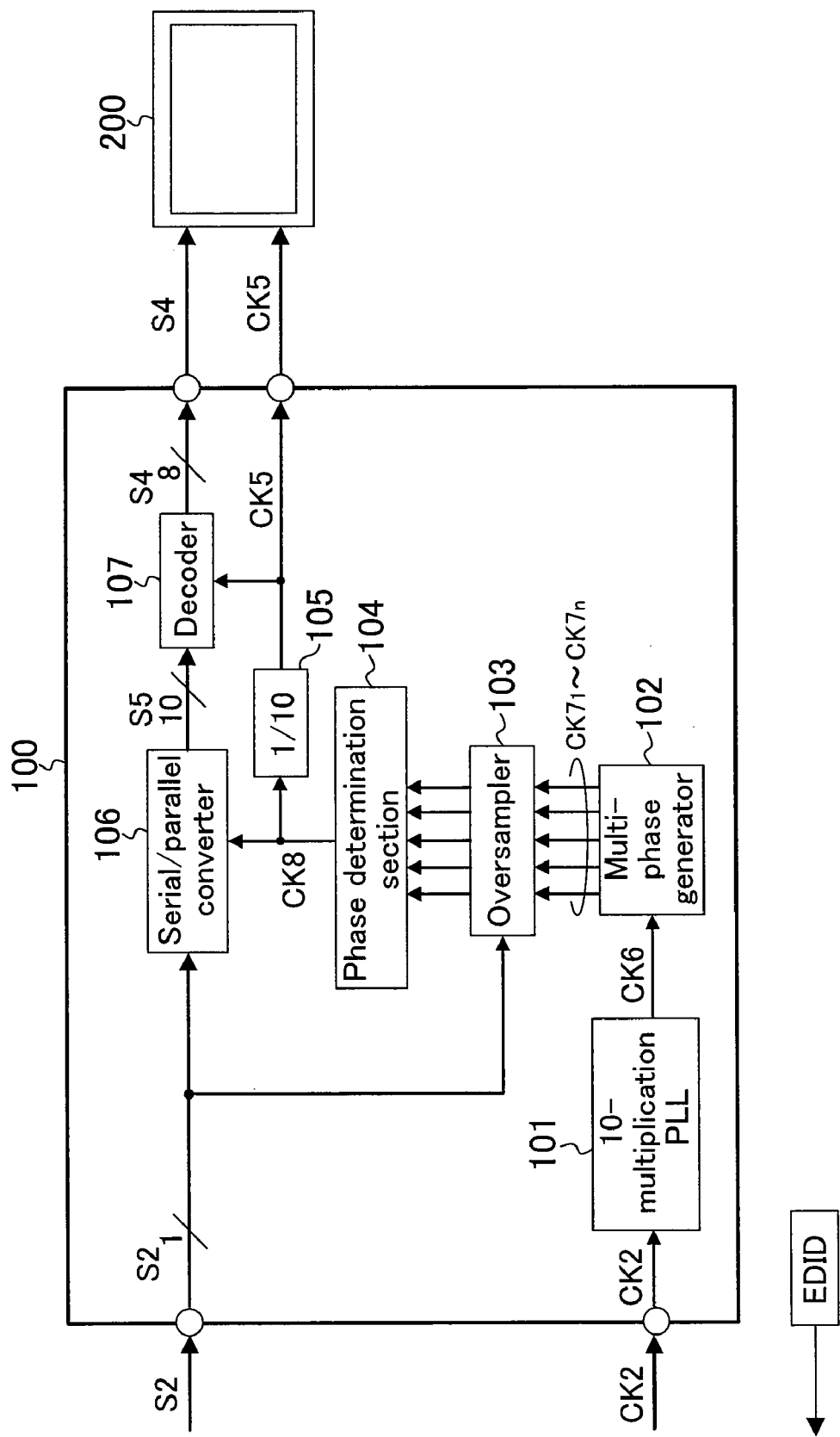
FIG. 2 shows a configuration of a receiver apparatus.

FIG. 2 shows an example of a configuration of the receiver apparatus receiving the serial data signal S2 and the clock signal CK2 from the transmitter apparatus as described above via a cable. A semiconductor integrated circuit 100 receives the serial data signal S2 and the clock signal CK2 and outputs a parallel data signal S4 and a clock signal CK5. A display apparatus 200 receives the parallel data signal S4 and the clock signal CK5 and displays video. The receiver apparatus may have EDID (Extended display identification data) which stores information such as the resolutions with which the display apparatus 200 can produce a display, the audio sample rates with which sound can be output, and the manufacturer, the product number, etc., of the semiconductor integrated circuit 100. As will be described later, the EDID is read out by the microcomputer 30 in the receiver apparatus.

In the semiconductor integrated circuit 100, a 10-multiplication PLL 101 receives the clock signal CK2 and produces a clock signal CK6 having a frequency that is 10 times higher. A multi-phase generator 102 receives the clock signal CK6 and shifts the phase thereof to produce n clock signals $CK7_i$ (i is an integer from 1 to n) that are equally phase-shifted from one another. The phase shifting can be realized by using a delay line, or the like. An oversampler 103 samples the serial data signal S2 in synchronism with the clock signals $CK7_1$ to $CK7_n$. In other words, the oversampler 103 performs an n-fold oversampling of the serial data signal S2.

Based on the sampling results of the oversampler 103, a phase determination section 104 determines the clock phase for sampling the serial data signal S2 that produces the largest setup and hold margin, and selects and outputs as a clock signal CK8 one of the clock signals $CK7_1$ to $CK7_n$ with which the margin is largest. The margin can be measured by determining whether a point of transition of the serial data signal S2 is present near the rising edge of each of the clock signals $CK7_1$ to $CK7_n$.

The frequency divider 105 receives the clock signal CK8 and divides the frequency thereof by 10 to thereby produce a clock signal CK5. A serial/parallel converter 106 receives the serial data signal S2, and converts the serial data signal S2 to a 10-bit parallel data signal S5 in synchronism with the clock signal CK8. Since the clock signal CK8 is selected by the phase determination section 104 as being most suitable for latching the serial data signal S2 as described above, this serial/parallel conversion is performed in a stable manner. A decoder 107 converts the 10-bit data signal S5 to the 8-bit data signal S4 in synchronism with the clock signal CK5. As described above, the parallel data signal S1 and the clock signal CK1 produced by the MPEG2 decoder 20 in the transmitter apparatus are recovered by the receiver apparatus as the parallel data signal S4 and the clock signal CK5.

Figure 3A:
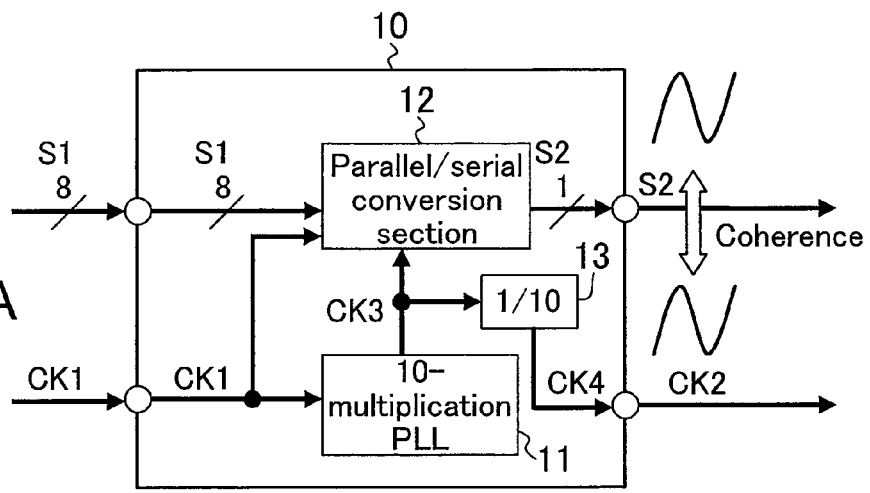
FIG. 3 shows switching between clock transmission schemes in a transmitter apparatus according to the present invention.
Figure 3B:
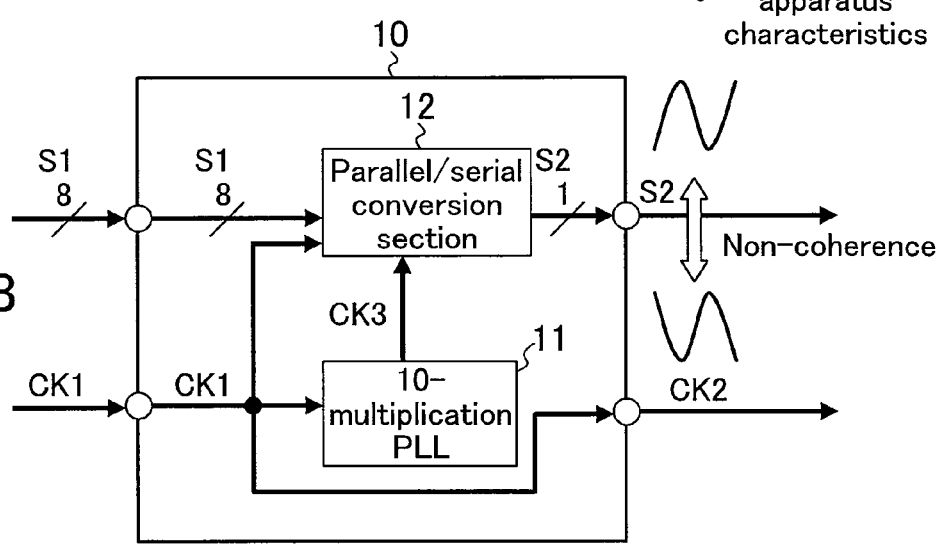

Referring back to FIG. 1, the microcomputer 30 controls the clock selection by the selector 14 using the control signal CTL. If the clock signal CK4 is selected by the selector 14, the clock transmission scheme of the present transmitter apparatus becomes a coherent clocking scheme similar to that of a transmitter apparatus 10 shown in FIG. 3(a). If the clock signal CK1 is selected by the selector 14, the clock transmission scheme of the present transmitter apparatus becomes a non-coherent clocking scheme similar to that of the transmitter apparatus 10 shown in FIG. 3(b). Thus, the selector 14 switches the coherent clocking scheme and the non-coherent clocking scheme from one to another depending on the characteristics of the receiver apparatus.

The microcomputer 30 may include a serial interface such as I2C (Inter Integrated Circuit) for reading out the EDID from the receiver apparatus. If the receiver apparatus has the EDID, the microcomputer 30 reads out the EDID from the receiver apparatus via I2C, and controls the clock selection by the selector 14 based on the EDID. Specifically, the microcomputer 30 extracts information identifying the receiver apparatus, e.g., the manufacturer, the model name, the common name, etc., from the obtained EDID. Then, referring to a table defining the correspondence between information identifying the receiver apparatus and the clock transmission scheme, the microcomputer 30 controls the selector 14 so as to select the clock transmission scheme corresponding to the information extracted from the EDID.

If the receiver apparatus does not have the EDID, the user may determine the clock transmission scheme by controlling the microcomputer 30 via a remote controller, or the like. Specifically, the microcomputer 30 controls the selector 14 so as to select the clock transmission scheme specified by the user. In such a case, a list of information identifying the receiver apparatus is displayed on a graphical user interface (GUI), and the user selects one from among the list. Referring to the table defining the correspondence between the information identifying the receiver apparatus and the clock transmission scheme, the microcomputer 30 controls the selector 14 so as to select a clock transmission scheme corresponding to the information selected by the user.

As described above, according to the present embodiment, it is possible to automatically or manually switch the clock transmission schemes of the transmitter apparatus from one to another according to the characteristics of the receiver apparatus. Therefore, no matter what receiver apparatus is connected to the present transmitter apparatus, a clock transmission scheme that is suitable for the characteristics of the receiver apparatus is selected. Thus, the present transmitter apparatus can be connected to any receiver apparatus, and the receiver apparatus receiving the serial data signal and the clock signal from the present transmitter apparatus can reliably recover the parallel data signal without mis-latching. Thus, in the receiver apparatus, noise on the displayed image, etc., due to a mis-matched clock transmission scheme is reduced.

Second Embodiment

FIG. 4 shows a configuration of a transmitter apparatus according to a second embodiment. The present transmitter apparatus includes a semiconductor integrated circuit 10B having a different configuration from that of the first embodiment. Specifically, the semiconductor integrated circuit 10B includes the 10-multiplication PLL 11 and the parallel/serial conversion section 12. The semiconductor integrated circuit 10B outputs, as the clock signal CK2, the clock signal CK1 to be the reference clock signal of the 10-multiplication PLL 11. In other words, the present transmitter apparatus transmits serial data in a non-coherent clocking scheme. What is different from the first embodiment will now be described.

The 10-multiplication PLL 11 is designed so that the transmission characteristic can be changed according to the control signal CTL. Typically, the transmission characteristic of a PLL can be changed by changing the bias current of a charge pump circuit or the time constant of a loop filter.

The microcomputer 30 changes the transmission characteristic of the 10-multiplication PLL 11 by the control signal CTL. This is done so that the transmission characteristic of the 10-multiplication PLL 11 is equal to that of the clock recovery circuit in the receiver apparatus, e.g., the 10-multiplication PLL 101 shown in FIG. 2. Specifically, referring to a table defining the correspondence between the information identifying the receiver apparatus and the transmission characteristic, the microcomputer 30 sets the transmission characteristic of the 10-multiplication PLL 11 to a transmission characteristic corresponding to the information specified by information extracted from the EDID or the information specified by the user.

As described above, according to the present embodiment, the transmission characteristic of the clock generation circuit in the transmitter apparatus is automatically or manually set to be equal to that of the clock recovery circuit in the receiver apparatus. Therefore, no matter what receiver apparatus is connected to the present transmitter apparatus, a clock signal having the same characteristic as that of the clock signal used in the parallel/serial conversion of the transmitter apparatus is recovered in the receiver apparatus, and the phase difference between the recovered clock signal and the serial data signal received by the receiver apparatus is always kept constant or nearly constant. Therefore, the receiver apparatus receiving the serial data signal and the clock signal from the present transmitter apparatus can reliably recover the parallel data signal without mis-latching, and noise on the displayed image, etc., due to a characteristic mis-match between the transmitter apparatus and the receiver apparatus is reduced.

Third Embodiment

Figure 5:
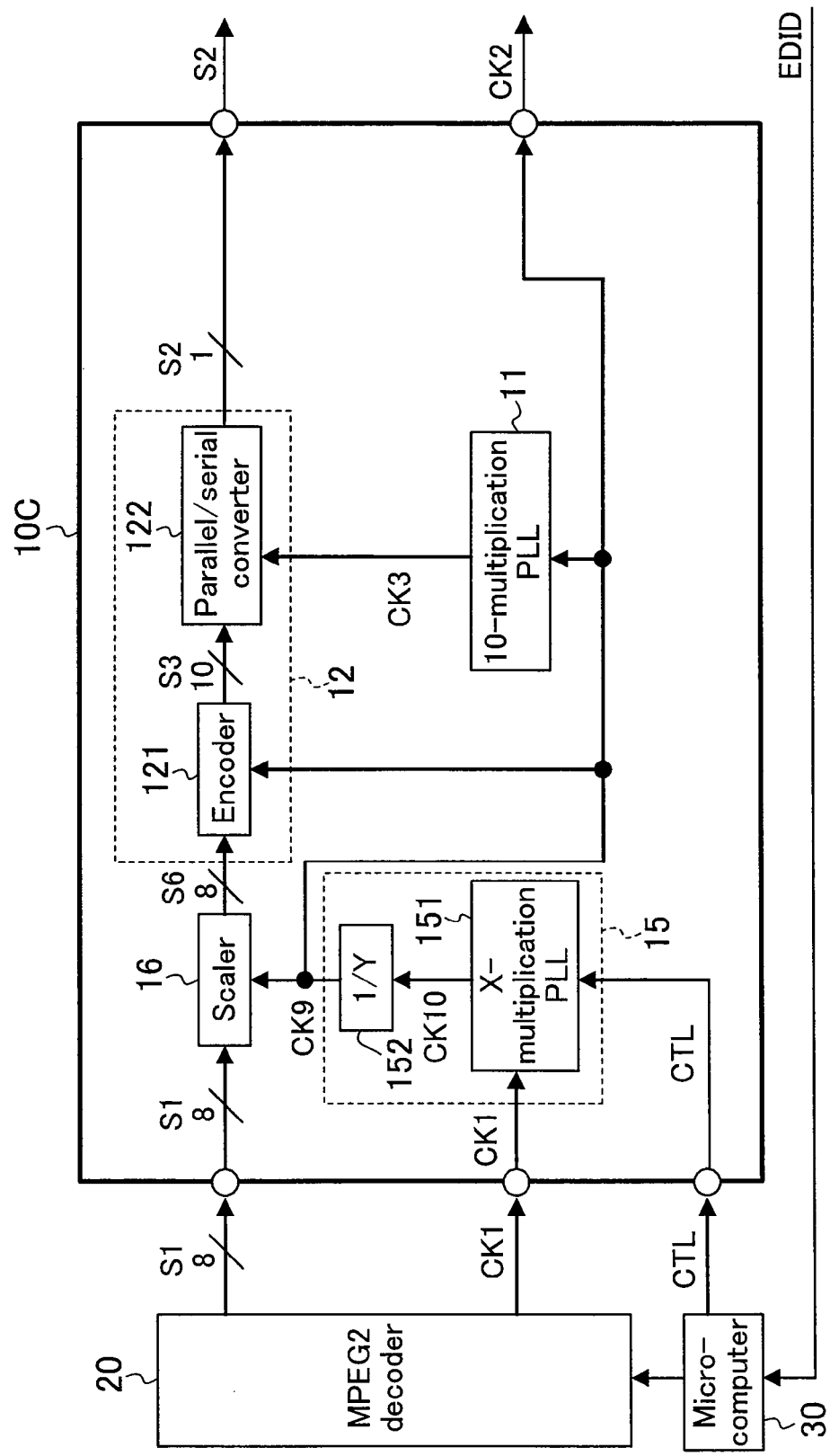
FIG. 5 shows a configuration of a transmitter apparatus according to a third embodiment.

FIG. 5 shows a configuration of a transmitter apparatus according to a third embodiment. The present transmitter apparatus includes a semiconductor integrated circuit 10C having a different configuration from those of the first and second embodiments, and has a function of removing the jitter of the transmitted clock signal CK2. Specifically, the semiconductor integrated circuit 10C includes the 10-multiplication PLL 11, the parallel/serial conversion section 12, a clock generation circuit 15 and a scaler 16. What is different from the first and second embodiments will now be described.

The clock generation circuit 15 receives the clock signal CK1 and produces a clock signal CK9 having a frequency that is X/Y times that of the clock signal CK1, where X and Y are natural numbers and X≠Y. Specifically, the clock generation circuit 15 includes an X-multiplication PLL 151 and a frequency divider 152. The X-multiplication PLL 151 receives the clock signal CK1 and produces a clock signal CK10 having a frequency that is X times that of the clock signal CK1. The frequency divider 152 receives the clock signal CK10 and divides the frequency thereof by Y to thereby produce the clock signal CK9.

The scaler 16 converts the parallel data signal S1 to a parallel data signal S6 in synchronism with the clock signal CK9. The scaler 16 serves as an up-converter for converting video data from an SD (Standard Definition) format to an HD (High Definition) format, and as a down-converter for converting video data from an HD format to an SD format. For example, where the scaler 16 serves as an up-converter, the clock generation circuit 15 produces the clock signal CK9 having a frequency of 74.175 MHz from the clock signal CK1 having a frequency of 27 MHz. The video data format conversion by the scaler 16 is not limited to the conversion between SD and HD, but may be any conversion.

The parallel/serial conversion section 12 receives the parallel data signal S6 and converts the parallel data signal S6 to the serial data signal S2 in synchronism with the clock signal CK3. The 10-multiplication PLL 11 receives the clock signal CK9 and produces the clock signal CK3 having a frequency that is 10 times higher. The semiconductor integrated circuit 10C outputs, as the clock signal CK2, the clock signal CK9 to be the reference clock signal of the 10-multiplication PLL 11. In other words, the present transmitter apparatus transmits serial data in a non-coherent clocking scheme. The clock generation circuit 15 not only supplies a synchronization clock signal to the scaler 16, but also functions as a jitter filter for the clock signal CK1. Thus, the clock signal CK2 transmitted from the present transmitter apparatus is a signal that has been shaped by the clock generation circuit 15 and from which jitter has been removed to some extent.

Figure 6:
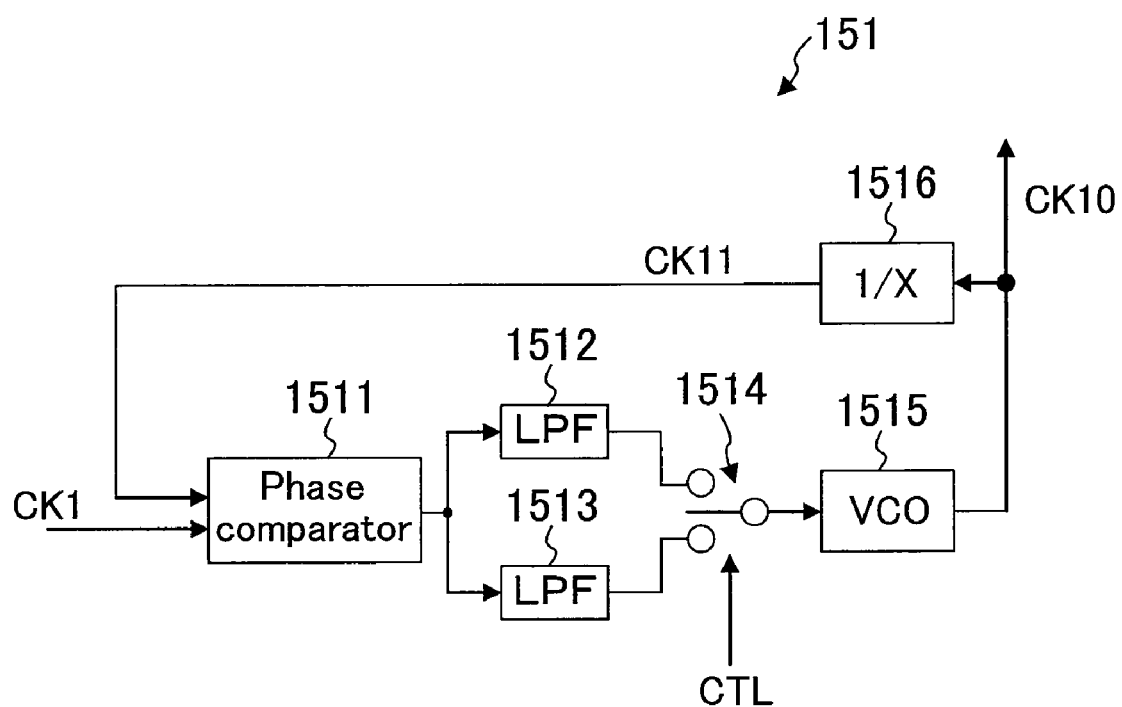
FIG. 6 shows an internal configuration of an X-multiplication PLL shown in FIG. 5.

Preferably, the pass band of the X-multiplication PLL 151 is variable. FIG. 6 shows an example of an internal configuration of the X-multiplication PLL 151. In the X-multiplication PLL 151, the frequency of the clock signal CK10 output from a voltage-controlled oscillator 1515 is divided by X by a frequency divider 1516. A phase comparator 1511 outputs a signal based on the phase difference between the clock signal CK1 and a clock signal CK11 fed back by the frequency divider 1516. This signal is given to the voltage-controlled oscillator 1515 after higher harmonics thereof are removed by a loop filter 1512 or 1513. Then, the voltage-controlled oscillator 1515 oscillates to produce the clock signal CK10 based on the signal given thereto. A loop filter is selected by a selection circuit 1514. It is assumed herein that the loop filter 1512 or 1513 have different time constants from each other. Thus, through the selection operation by the selection circuit 1514, it is possible to switch the pass band of the X-multiplication PLL 151 from one to another. The switching of the pass band of the X-multiplication PLL 151 can be realized by configurations other than the configuration described above.

The microcomputer 30 controls the loop filter selection by the selection circuit 1514 using the control signal CTL. Specifically, referring to a table defining the correspondence between the information identifying the receiver apparatus and the pass band of the clock generation circuit 15, the microcomputer 30 sets the pass band of the clock generation circuit 15 to a pass band corresponding to the information extracted from the EDID or the information specified by the user. The operation of the MPEG2 decoder is controlled by the microcomputer 30. Alternatively, at the time of instructing to switch the clock signal CK1 to be output from the MPEG2 decoder 20 from one to another, the pass band of the clock generation circuit 15 may be switched to a pass band corresponding to the frequency of the clock signal CK1 after the switching.

As described above, according to the present embodiment, a transmitter apparatus of a non-coherent clocking scheme transmits a clock signal whose jitter has been removed. Moreover, as the optimal pass band of the reference clock signal is selected according to the characteristics of the receiver apparatus or the signal output from the data generation circuit, the jitter of the clock signal transmitted from the transmitter apparatus is most effectively removed. Therefore, no matter what receiver apparatus is connected to the present transmitter apparatus, the receiver apparatus receiving the serial data signal and the clock signal from the present transmitter apparatus can reliably recover the parallel data signal without mis-latching, and noise on the displayed image, etc., on the receiver apparatus is reduced.

Fourth Embodiment

Figure 7:
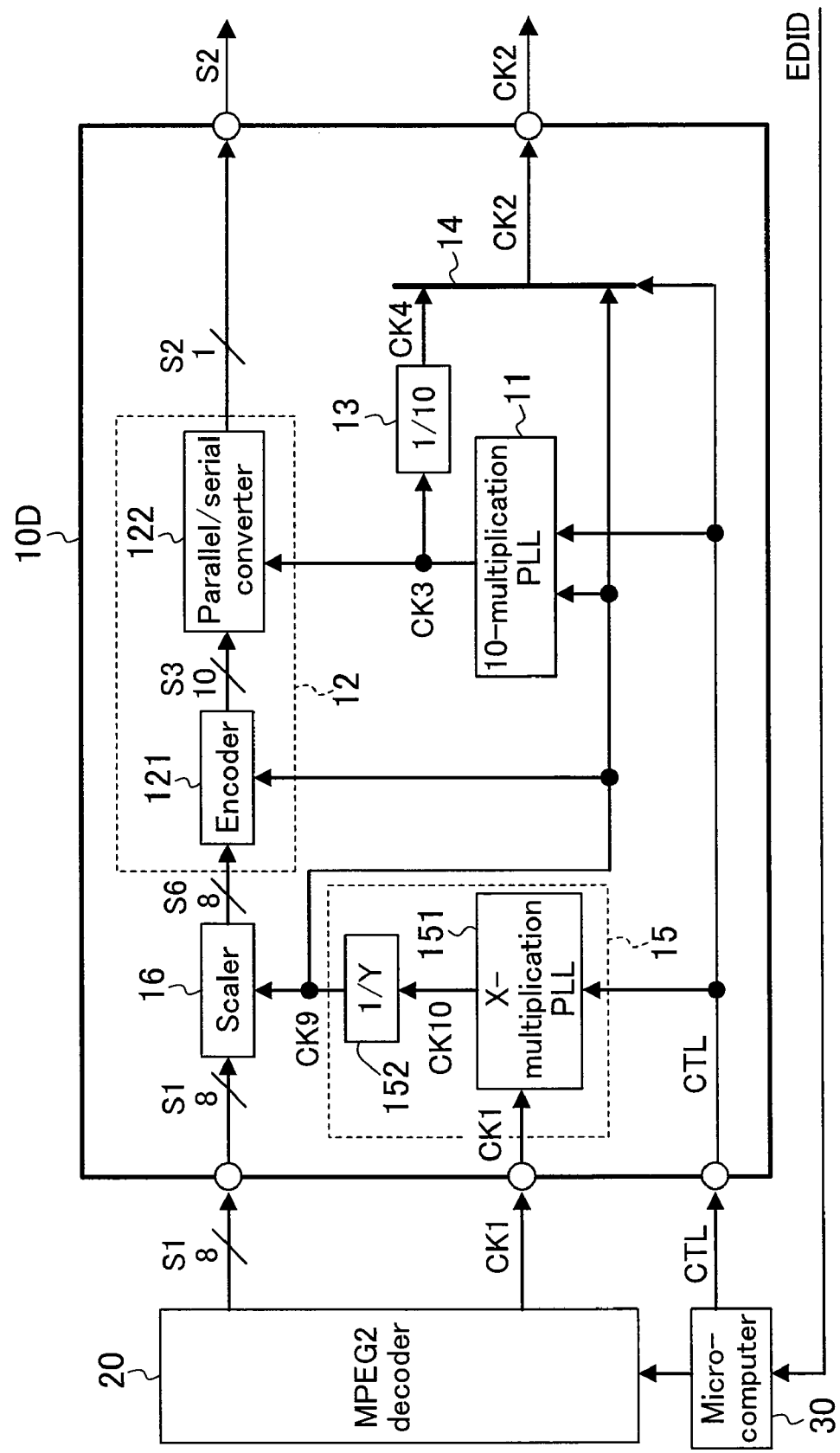
FIG. 7 shows a configuration of a transmitter apparatus according to a fourth embodiment.

FIG. 7 shows a configuration of a transmitter apparatus according to a fourth embodiment. The present transmitter apparatus incorporates all the elements of the first to third embodiments. With a transmitter apparatus of a coherent clocking scheme, a clock signal shaped by the clock generation circuit (e.g., the 10-multiplication PLL 11 shown in FIG. 1) is transmitted. If the jitter removal is insufficient, it may become impossible to recover the parallel data signal in the receiver apparatus. In contrast, where the present transmitter apparatus operates in a coherent clocking scheme, jitter is filtered through two steps of the clock generation circuit 15 and the 10-multiplication PLL 11, whereby jitter of the clock signal CK2 transmitted can be removed sufficiently.

INDUSTRIAL APPLICABILITY

The semiconductor integrated circuit and the transmitter apparatus of the present invention have a high connectivity and can transmit a jitter-suppressed clock signal, and are therefore useful in DVD players or recorders, etc, for transmitting DVI signals or HDMI signals to various display apparatuses.

The invention claimed is:

1. A semiconductor integrated circuit for receiving a parallel data signal and a first clock signal and outputting a serial data signal and a second clock signal, comprising:
   a clock generation circuit for receiving the first clock signal and producing a third clock signal obtained by multiplying the first clock signal by N, where N is an integer of 1 or more;
   a parallel/serial conversion section for receiving the parallel data signal and converting the parallel data signal to the serial data signal in synchronism with the third clock signal;
   a frequency divider for receiving the third clock signal and producing a fourth clock signal obtained by dividing a frequency of the third clock signal by N; and
   a selector for receiving the first and fourth clock signals and selectively outputting, as the second clock signal, one of these clock signals according to a control signal given thereto.

2. The semiconductor integrated circuit of claim 1, wherein a transmission characteristic of the clock generation circuit varies according to a control signal given thereto.

3. A semiconductor integrated circuit for receiving a parallel data signal and a first clock signal and outputting a serial data signal and a second clock signal, comprising:
   a clock generation circuit for receiving the first clock signal and producing a third clock signal obtained by multiplying the first clock signal by N, where N is an integer greater than 1; and
   a parallel/serial conversion section for receiving the parallel data signal and converting the parallel data signal to the serial data signal in synchronism with the third clock signal,
   wherein a transmission characteristic of the clock generation circuit is a jitter characteristic and varies according to a control signal given thereto, and the first clock signal is output as the second clock signal.

4. A semiconductor integrated circuit for receiving a parallel data signal and a first clock signal and outputting a serial data signal and a second clock signal, comprising:
- a first clock generation circuit for receiving the first clock signal and producing a third clock signal obtained by multiplying the first clock signal by X/Y, where X and Y are natural numbers and X≠Y;
- a scaler for receiving the parallel data signal and converting the parallel data signal to a second parallel data signal in synchronism with the third clock signal;
- a second clock generation circuit for receiving the third clock signal and producing a fourth clock signal obtained by multiplying the third clock signal by N, where N is an integer of 1 or more; and
- a parallel/serial conversion section for receiving the second parallel data signal and converting the second parallel data signal to the serial data signal in synchronism with the fourth clock signal.

5. The semiconductor integrated circuit of claim 4, wherein a pass band of the first clock generation circuit varies according to a control signal given thereto.

6. The semiconductor integrated circuit of claim 4, wherein:
- the parallel data is video data; and
- the scaler performs a format conversion of the video data between SD (Standard Definition) and HD (High Definition).

7. The semiconductor integrated circuit of claim 4, wherein a transmission characteristic of the second clock generation circuit varies according to a control signal given thereto.

8. The transmitter apparatus of claim 4, wherein the third clock signal is output as the second clock signal.

9. A semiconductor integrated circuit for receiving a parallel data signal and a first clock signal and outputting a serial data signal and a second clock signal, comprising:
- a first clock generation circuit for receiving the first clock signal and producing a third clock signal obtained by multiplying the first clock signal by X/Y, where X and Y are natural numbers and X≠Y;
- a scaler for receiving the parallel data signal and converting the parallel data signal to a second parallel data signal in synchronism with the third clock signal;
- a second clock generation circuit for receiving the third clock signal and producing a fourth clock signal obtained by multiplying the third clock signal by N, where N is an integer of 1 or more;
- a parallel/serial conversion section for receiving the second parallel data signal and converting the second parallel data signal to the serial data signal in synchronism with the fourth clock signal;
- a frequency divider for receiving the fourth clock signal and producing a fifth clock signal obtained by dividing a frequency of the fourth clock signal by N; and
- a selector for receiving the third and fifth clock signals and selectively outputting, as the second clock signal, one of these clock signals according to a control signal given thereto.

10. The semiconductor integrated circuit of one of claims 1, 3, 4 and 9, wherein the serial data signal and the second clock signal are in conformity with a DVI standard or an HDMI standard.

11. A transmitter apparatus having the semiconductor integrated circuit of one of claims 1, 3, 4 and 9, comprising:
- a data generation circuit for producing the parallel data signal and the first clock signal to be input to the semiconductor integrated circuit; and
- a control circuit for producing the control signal to be input to the semiconductor integrated circuit based on information regarding a receiver apparatus receiving the serial data signal and the second clock signal output from the semiconductor integrated circuit.

12. The transmitter apparatus of claim 11, wherein the control circuit obtains the information from the receiver apparatus.

13. The transmitter apparatus of claim 11, wherein the information includes information identifying a manufacturer of the receiver apparatus.

14. A transmitter apparatus having the semiconductor integrated circuit of one of claims 4 and 9, comprising:
- a data generation circuit for producing the parallel data signal and the first clock signal to be input to the semiconductor integrated circuit; and
- a control circuit for producing the control signal to be input to the semiconductor integrated circuit, wherein:
- the data generation circuit switches a frequency of the first clock signal from one to another according a control by the control circuit; and
- at a time of instructing the data generation circuit to switch a frequency of the first clock signal from one to another, the control circuit switches the control signal to another control signal corresponding to the frequency of the first clock signal after the switching.

* * * * *